(12) United States Patent
Matsuda et al.

(10) Patent No.: US 7,221,340 B2
(45) Date of Patent: May 22, 2007

(54) SELF LIGHT EMITTING TYPE DISPLAY DEVICE

(75) Inventors: Atsusi Matsuda, Yonezawa (JP); Yoichi Satake, Yonezawa (JP)

(73) Assignee: Tohoku Pioneer Corporation, Tendo-shi (JP)

( * ) Notice: Subject to any disclaimer, the term of this patent is extended or adjusted under 35 U.S.C. 154(b) by 598 days.

(21) Appl. No.: 10/847,588

(22) Filed: May 18, 2004

(65) Prior Publication Data

US 2004/0252086 A1 Dec. 16, 2004

(30) Foreign Application Priority Data

May 29, 2003 (JP) ............................. 2003-152168

(51) Int. Cl.
*G09G 3/30* (2006.01)
(52) U.S. Cl. .......................................... 345/76; 345/77
(58) Field of Classification Search ............. 315/169.1, 315/169.3, 169.4; 345/76, 77, 80, 92
See application file for complete search history.

(56) References Cited

U.S. PATENT DOCUMENTS

| | | | |
|---|---|---|---|
| 5,914,484 A * | 6/1999 | Tawarayama et al. | 250/205 |
| 6,509,690 B2 * | 1/2003 | Sempel et al. | 315/169.3 |
| 6,911,781 B2 * | 6/2005 | Yamazaki et al. | 315/169.3 |
| 2003/0090446 A1 * | 5/2003 | Tagawa et al. | 345/76 |
| 2004/0222954 A1 * | 11/2004 | Lueder | 345/87 |
| 2005/0112801 A1 * | 5/2005 | Russell et al. | 438/116 |
| 2006/0132401 A1 * | 6/2006 | Yamazaki et al. | 345/81 |

FOREIGN PATENT DOCUMENTS

JP 11-282420 10/1999

* cited by examiner

*Primary Examiner*—Nitin Patel
(74) *Attorney, Agent, or Firm*—Westerman, Hattori, Daniels & Adrian, LLP.

(57) ABSTRACT

Provided is a self light emitting type display device which can correct variations in characteristics of self-emitting elements arranged in a display panel, a driver IC which drives lighting of the self-emitting elements, and the like.

A self-emitting module 1 is composed of a display panel 2 on which a plurality of self-emitting elements are arranged, a flexible circuit board 3 whose one end portion is connected with the display panel, a memory 10 which is loaded on the circuit board 3 and in which data for adjusting light emission intensities of the self-emitting elements is stored, and a drive unit 5 which is loaded also on the circuit board and which is equipped with a function of generating the drive current which is for adjusting the light emission intensities of the respective light emitting elements based on the data stored in the memory. Since the memory 10 and the drive unit 5 are loaded in the self-emitting module 1, in a state in which the self-emitting module is an individual module body before the module 1 is connected with a main body substrate 6 side, intensity adjustment of the respective light emitting elements can be performed, and adjustment work for intensity prior to shipping of the product can be made easier.

20 Claims, 3 Drawing Sheets

SELF LIGHT EMITTING TYPE DISPLAY DEVICE

BACKGROUND OF THE INVENTION

1. Field of the Invention

The present invention relates to a display device in which a plurality of self-emitting pixels are arranged, for example, a self light emitting type display device in which organic EL (electroluminescent) elements are arranged in a matrix pattern as light emitting elements, and particularly to a self light emitting type display device which can correct variations in characteristics of the self-emitting elements, a driver IC which drives lighting of the self-emitting elements, and the like.

2. Description of the Related Art

A display employing a display panel which is constructed by arranging light emitting elements in a matrix pattern has been developed widely. As the light emitting element employed in such display panel, an organic EL element in which an organic material is employed in a light emitting layer has attracted attention, and a display of a self-emitting type in which the organic EL elements are arranged in a matrix pattern has been commercialized partly. This is because of a background that by employing, in a light emission functional layer constituting an EL element, an organic compound which enables an excellent light emission characteristic to be expected, progress in a high efficiency and a long life by which an EL element can be fit for practical use has been made.

As a display device employing the above-mentioned organic EL elements, a passive matrix type display device in which EL elements are simply arranged in a matrix pattern and an active matrix type display device in which respective active elements for example constituted by TFTs (thin film transistors) are added to respective EL elements arranged in a matrix pattern have been proposed.

In the former passive matrix type display device, respective organic EL layers as light emitting pixels are formed at respective crossing positions between first electrode lines arranged in a striped pattern and second electrode lines which are arranged in a striped pattern so as to cross the first electrode lines at right angles. This passive matrix type display device can be provided as a relatively simple structure. On the other hand, in the latter active matrix type display device, although the respective active elements constituted by the above-mentioned TFTs have to be provided for respective pixels, since a momentary intensity of an EL element as a light emitting pixel can be reduced, the lives of the light emitting pixels can be prolonged. Further, the active matrix typed is play device has an advantage such as a less crosstalk light emission between pixels and the like, thereby being suitable for a large screen display and a high-precision display.

In any case in which either one of the above-described type display devices is utilized, this type of self-emitting element typified by an organic EL element has a characteristic that the element emits light at an intensity approximately proportional to the drive current supplied thereto. However, there is a problem that variations in light emission intensities with respect to the drive current occur among respective light emitting elements. Meanwhile, variations in driver ICs which drive lighting of respective light emitting elements occur as a matter of the fabrication thereof. Further, in the active matrix type display device, variations in the above-mentioned TFTs each of which is formed for each pixel unit occur as a matter of the fabrications thereof. Thus, there is a problem that it is difficult to make intensity characteristics on a display screen uniform.

Recently, a display panel which realizes full color display employing as subpixels respective EL elements which emit lights of respective R (red), G (green), and B (blue) colors has been developed. In this case, there is a problem that light emission efficiencies with respect to forward voltages of the respective colors of light emitting elements are different, and it is necessary to adjust these light emission intensities in advance in order to adjust color (white) balance.

In the above-described display devices, in order to correct variations in current vs. intensity of respective light emitting elements, variations in driver ICs, and the like before the product is shipped, and further in order to adjust white balance among respective subpixels, work of adjusting respective drive current values outputted from respective driver ICs has been done. Actual conditions of such adjustment work and one example of adjustment method are disclosed in Japanese Patent Application Laid-Open No. Hei 114-282420 (paragraphs 0014 to 0024 and FIGS. 1 to 5) shown below.

The work for adjusting drive current values in the driver ICs that is done before the product is shipped is executed in a state of semi-finished products of a display device for example shown in FIG. 1. That is, in FIG. 1, reference numeral 1 designates a self-emitting module, and this self-emitting module 1 is composed of a display panel 2, an FPC (flexible printed circuit board) 3, a connector 4, and a driver IC 5 loaded on the FPC 3.

In the display panel 2 constituting the self-emitting module 1, although not specifically shown in the drawing, a large number of self-emitting elements, for example, organic EL elements, are arranged in a matrix pattern, and thus images can be reproduced in a light emitting state. One end of the FPC 3 is connected with an end edge of the panel 2, for example, by means of thermocompression bonding and the like, and the other end of the FPC 3 is connected with the connector 4 so as to be connected via the connector 4 with a main body substrate 6 which will be described later.

In the driver IC 5 loaded on the FPC 3, mixedly loaded are an anode driver and a cathode driver for selectively driving light emission of the light emitting elements arranged on the display panel 2, constant current sources which supply constant current to respective EL elements arranged on the display panel 2, and the like. The driver IC 5 is mutually connected on a way on the FPC 3 from the connector 4 to the display panel 2.

In the main body substrate 6, loaded are a voltage boosting circuit 7 for example by means of a DC/DC converter, a control CPU 8 which controls the driver IC 5 in the self-emitting module 1 side and which performs data transmission and the like, an intensity setting circuit 9 which can set current values of the respective constant current sources loaded in the driver IC 5, and the like.

As disclosed in Japanese Patent Application Laid-Open No. Hei 11-282420,in order to implement the work of adjusting respective drive current values for adjusting variations in intensities of respective light emitting elements or white balance, in the structure of a conventional display device shown in FIG. 1, since the intensity setting circuit 9 is loaded in the main body substrate 6 side, the adjustment work cannot be implemented unless the self-emitting module 1 is connected with the main body substrate 6 side via the connector 4. Thus, once connecting the self-emitting module 1 with the main body substrate 6 side via the connector 4 and measuring intensities of the display panel 2 in this state prevents fabrication work from being efficient, resulting in a primary factor of increasing the fabrication cost.

That is, in the sense that the fabrication control has to be efficient, it is desired that the intensities of respective light emitting elements can be adjusted, that is, that respective current values supplied from the driver IC 5 can be adjusted in a state in which the module 1 is an individual body before the self-emitting module 1 is connected with the main body substrate 6 side.

SUMMARY OF THE INVENTION

The present invention has been developed in response to the above-described technical background, and it is an object of the present invention to provide a self light emitting type display device in which intensity adjustment of respective light emitting elements arranged on a display panel can be implemented in a state of individual of the self-emitting module so that the fabrication cost can be reduced.

As described in a first aspect, a self light emitting type display device according to the present invention which has been developed to carry out the object is characterized by comprising a self-emitting module comprising a display panel on which a plurality of self-emitting elements are arranged, a circuit board whose one end portion is connected with the display panel to supply drive current to the respective self-emitting elements of the display panel, a memory which is loaded on the circuit board and in which data for adjusting light emission intensities of the respective light emitting elements is stored, and a drive unit which is loaded on the circuit board and which is equipped with a function of generating the drive current which is for adjusting the light emission intensities of the respective light emitting elements based on the data stored in the memory and a main body substrate which is connected with the other end of the circuit board in the self-emitting module and in which an operational power supply means supplying operational power source to the self-emitting module side via the circuit board is loaded.

DESCRIPTION OF THE PREFERRED EMBODIMENTS

Figure 1:
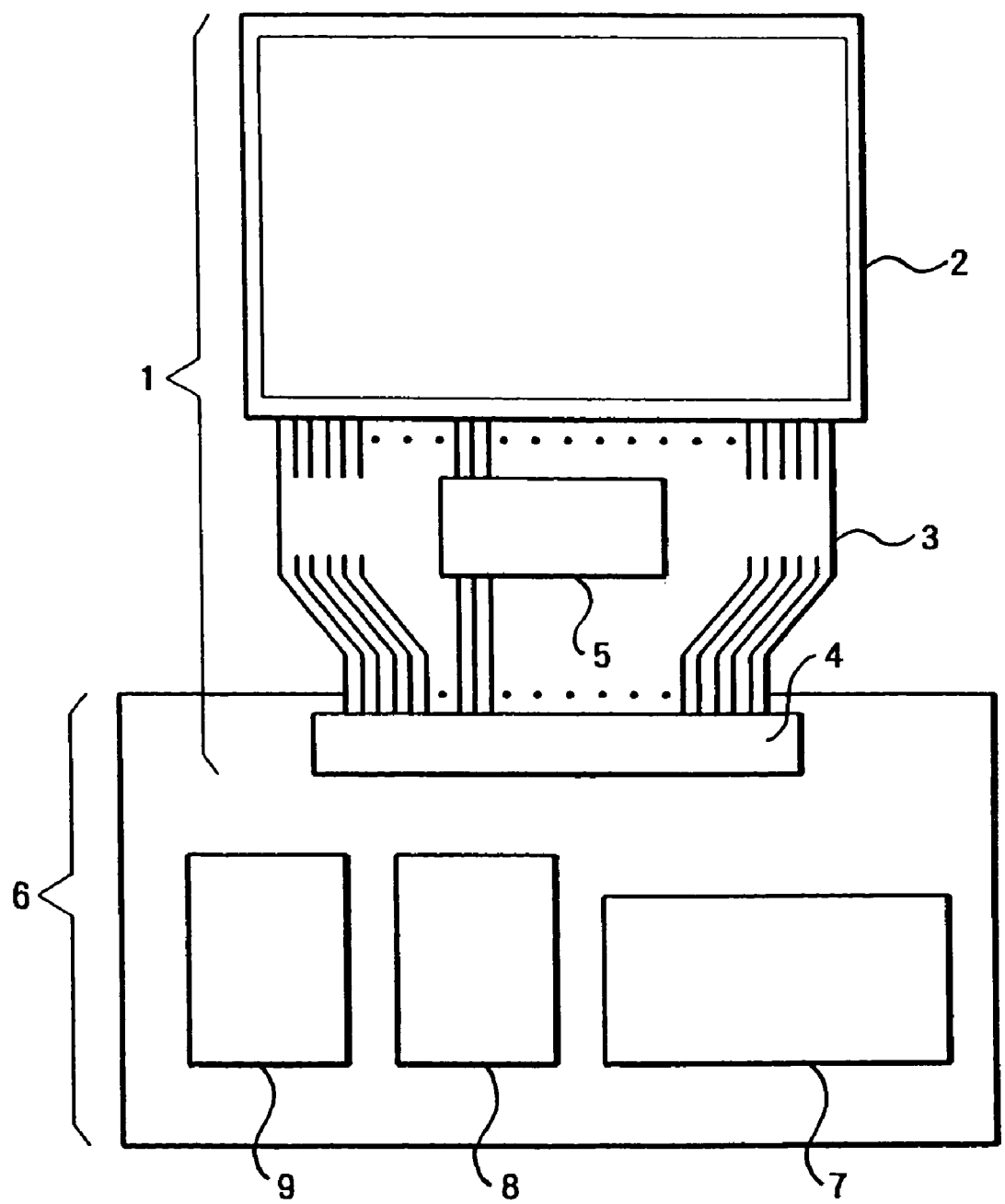
FIG. 1 is a schematic view showing a state of semi-finished products in a conventional self light emitting type display device.

A self light emitting type display device according to the present invention will be described below with reference to embodiments shown in the drawings. Although organic EL elements are employed to show a structure in which the organic EL elements are driven in a passive matrix system in the embodiments described below, the present invention does not adhere to such structure and can be applied for example to an active matrix type display device.

Figure 2:
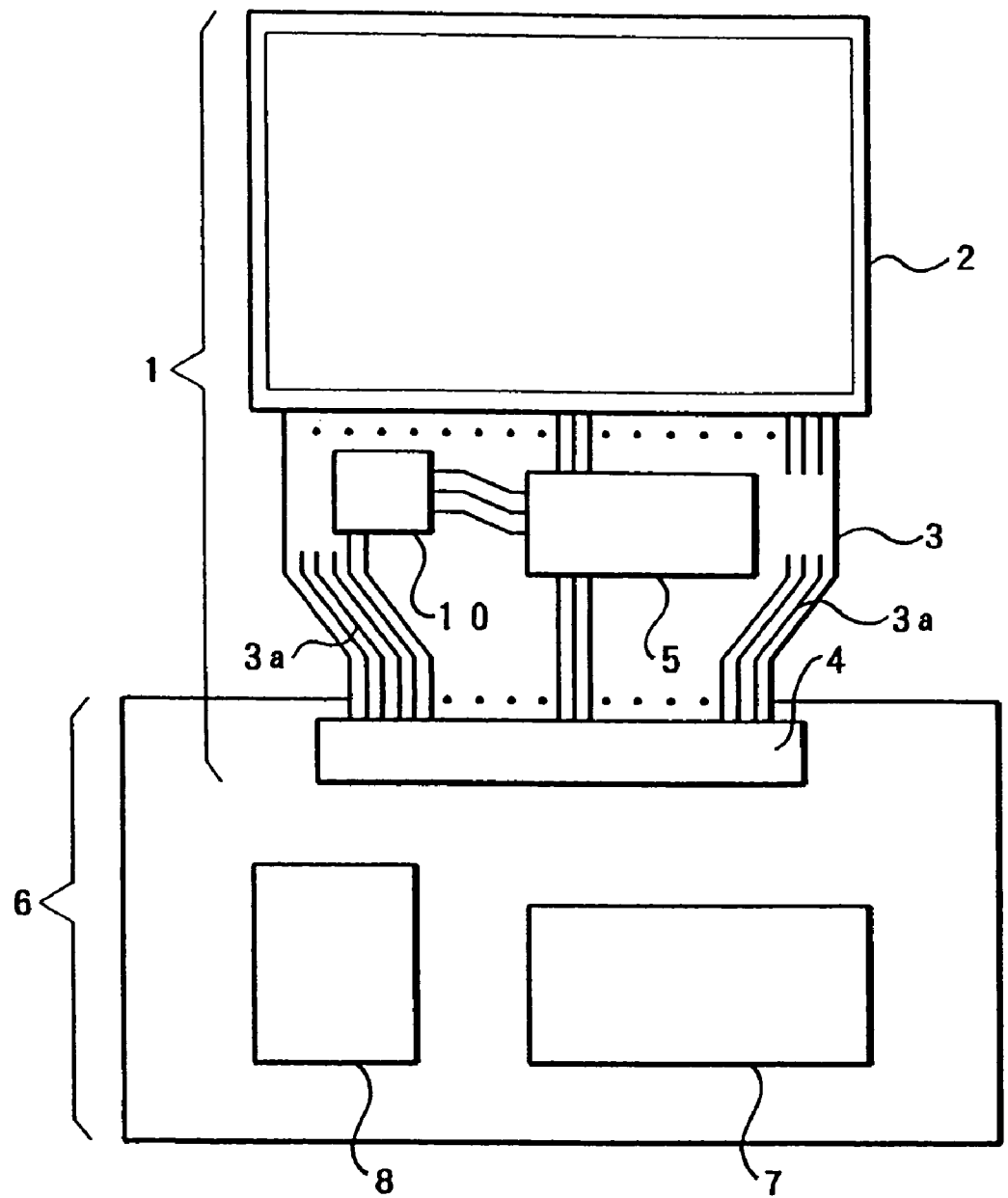
FIG. 2 is a schematic view showing a state of semi-finished products in a self light emitting type display device according the present invention.

FIG. 2 shows a state of semi-finished products of a self light emitting type display device according to the present invention, and parts with the same functions as those of the components explained with reference to FIG. 1 are designated by the same reference numerals. In the structure shown in FIG. 2 also, similarly to the structure shown in FIG. 1, a self-emitting module 1 and a main body substrate 6 can be separated.

This self-emitting module 1 is composed of a display panel 2 on which a plurality of organic EL elements as self-emitting elements are arranged, an FPC 3 whose one end portion is connected with an end edge of the display panel 2 for example by means of thermocompression bonding, a memory 10 which is loaded on this FPC 3 and in which data for adjusting the light emission intensities of the respective self-emitting elements is stored, a drive IC 5 which is also loaded on the FPC 3 and which, as a drive unit, is equipped with a function of generating drive current for adjusting light emission intensities of the respective light emitting elements based on the data stored in the memory 10, and a connector 4 connected with the other end portion of the FPC 3.

On the other hand, in the main body substrate 6, loaded are a voltage boosting circuit 7 for example by means of a DC/DC converter and a control CPU 8. The main body substrate 6 is constructed in such a way that an operational power supply from the boosting circuit 7 is supplied to the memory 10, the drive IC 5, and the like via the connector 4 which is detachably connected with the main body substrate 6 and via respective wiring lines 3a, for example made of cupper foil, arranged on the FPC 3. The main body substrate 6 is also constructed in such a way that a control signal for the drive IC 5, a data signal, and the like are transmitted from the control CPU 8 similarly via the respective wiring lines 3a. Drive current is supplied from the driver IC 5 to the respective light emitting elements arranged on the display panel 2 via the respective wiring lines 3a on the FPC 3.

In the drive IC 5 loaded on the FPC 3, mixedly loaded are an anode driver and a cathode driver which will be described later and which receive operational power supply from the voltage boosting circuit 7 to selectively drive light emission of the light emitting elements arranged on the display panel 2, constant current sources which will be described later and which supply constant current to respective EL elements arranged on the display panel 2, and the like. The driver IC 5 is constructed so as to be able to receive data from the memory 10 to control respective current values of the constant current sources loaded in the drive IC 5.

It is desired that data stored in the memory 10 is rewritable and that the memory 10 has a non-volatile function, and for example an EEPROM, a flash memory, or the like may be utilized suitably. In the memory 10 it is desired to set an area in which data related to fabrication history of the self-emitting module, for example, serial number, lot number, date and time, device number, workman number, and the like, can be written other than data for adjusting respective light emission intensities of the self-emitting elements, whereby such data can be utilized effectively at the time of later maintenance or the like.

Figure 3:
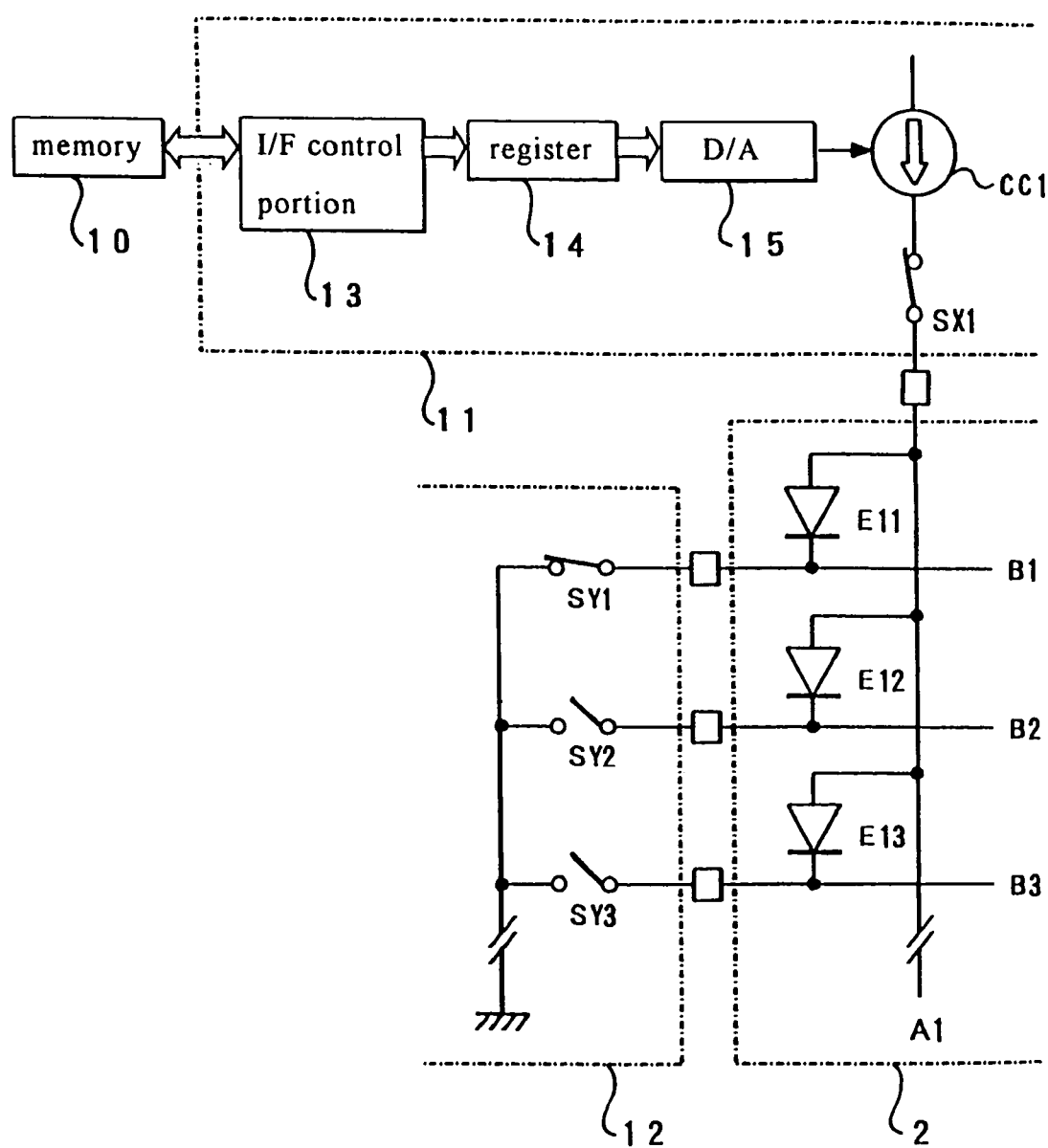
FIG. 3 is a block diagram showing more specifically parts of structures of a memory, a driver IC, and a display panel shown in FIG. 2.

FIG. 3 shows parts of structures of the memory 10, the driver IC 5, and the display panel 2 shown in FIG. 2 more specifically than therein. Here, in the drive IC 5, an anode driver 11 and a cathode driver 12 shown in FIG. 3 are loaded. In the display panel 2, an anode drive line A1 to which constant current is supplied from a constant current source CC1 via a drive switch SX1 in an anode driver 11 is formed in a vertical direction. In FIG. 3, although only one anode drive line A1 is shown for convenience of space, in reality anode drive lines whose number corresponds to the number of columns of self-emitting elements which are arranged on the display panel 2 are formed.

Cathode scanlines B1 to B3 which are selectively connected to a reference potential point via scan switches SY1 to SY3 provided in the cathode driver 12 are formed in a horizontal direction in the display panel 2. In FIG. 3, although only three cathode drive lines are shown for convenience of space, in reality cathode drive lines whose number corresponds to the number of rows of self-emitting elements which are arranged on the display panel 2 are formed. Anodes and cathodes of organic EL elements E11 to E13 as the light emitting elements are connected to the anode drive line and the cathode scan lines, respectively, at positions at which respective anode drive line and cathode scan lines intersect each other to form a passive drive structure.

With such passive drive structure, the scan switches in the cathode driver 12 are turned on one after another to allow the respective cathode scan lines to connect the reference potential point, whereby cathode scan is executed. At this time, constant current is supplied from the constant current source via the drive switch to the anode drive line, corresponding to the cathode scan lines which are scanned so that the EL elements at their crossing positions can be emitted selectively. Such drive control is executed by a control signal and a data signal supplied from the control CPU 8 to the driver IC 5.

In the embodiment shown in FIG. 3, an adjustment means for adjusting the light emission intensities of the respective light emitting elements is loaded in the anode driver 11 which is loaded in the driver IC 5. That is, in the intensity adjustment means, as shown in FIG. 3, an interface and control portion 13 which can read out and write intensity adjustment data of and in the memory 10 is provided, and this control portion 13 controls so as to temporarily store that data in a register 14. The digital data stored in the register 14 is converted to an analogue signal by a D/A conversion circuit 15, and by this analogue signal the current value from the constant current source CC1 is controlled.

In the above-described structure, in the case where intensity adjustment of the respective light emitting elements is implemented before the product is shipped, the light of the respective EL elements in the display panel 2 is emitted by a predetermined drive current, and the light emission intensities of the respective EL elements whose light is emitted are read by an unillustrated CCD camera. Correction data corresponding to a gap between intensity data read by the CCD camera and a predetermined standard intensity is written in the memory 10 via the interface and control portion 13.

Thus, thereafter, the control portion 13 reads out the intensity adjustment data corresponding to the respective light emitting elements written in the memory 10, and by adjusting the current value of the constant current source CC1 individually while utilizing the register 14 and the D/A converter 15, a light emission state can be obtained in which variations of the respective light emitting elements and variations for example of constant current sources in the anode driver 11 are corrected.

As described above, the adjustment means performing intensity adjustment for respective light emitting elements can be realized by the memory 10 storing the intensity adjustment data shown in FIG. 2 and a function loaded in the driver IC 5. In other words, in a state in which the self-emitting module is an individual body before the self-emitting module 1 is connected with the main body substrate 6 side, intensity adjustment of the respective light emitting elements can be performed, that is, the respective current values supplied from the driver IC 5 can be set. Accordingly, the above-described structure can contribute to a substantial reduction of the fabrication cost since the above-described adjustment work can be executed in a state in which the self-emitting module is an individual body.

The above description is on the assumption of the case where a so-called monochrome display panel is adopted in which light emitting elements by which light emission of the same color is performed respectively are employed as the respective light emitting elements arranged on the display panel 1. As already described, organic materials which emit light of respective R, G, and B colors have been provided in the organic EL element, and a display panel realizing a full color display using EL elements utilizing these materials as respective subpixels has been developed. In such display panel realizing the full color display, a need of adjusting color (white) balance while considering not only variations in current vs. intensity characteristics of respective EL elements but also light emission efficiencies of EL elements which emit respective color lights arises.

In the display panel realizing the full color display, the full color display can be realized, for example, by defining respective anode drive lines arranged in a striped pattern as drive lines of R, G, and B in this order and by forming films by organic materials which emit R, G, and B lights corresponding to the respective drive lines.

That is, since R, G, and B are defined for each drive line, by utilizing the structure which controls the constant current values for respective drive lines as-shown in FIG. 3 and by storing data which is for adjusting the intensities of respective colors in the memory 10, intensity adjustment which takes account of the light emission efficiency of EL elements emitting respective R, G, and B color lights can be performed, that is, color (white) balance can be adjusted.

Accordingly, in the case where the intensity adjustment for respective R, G, and B EL elements is performed before the product is shipped also, the adjustment means for light emission intensities in the anode driver 11 shown in FIG. 3 which has already been described can be utilized as it is. In this case, the respective EL elements which emit respective R, G, and B lights in the display panel 2 are lit by predetermined drive current, and the light emission intensities of the lit respective EL elements are read by an unillustrated CCD camera.

Gaps between respective actual measurement intensity data of R, G, and B read by the CCD camera and standard intensity data by which synthesized white light by the R, G, and B becomes a predetermined intensity and chromaticity are calculated, and respective correction data corresponding to the gaps is written in the memory 10 via the interface and control portion 13.

Thus, thereafter, the intensity adjustment data corresponding to the respective light emitting elements which is written in the memory 10 is read out by the control portion 13, and the current value of the constant current source CC1 is adjusted individually while utilizing the register 14 and the D/A converter 15, so that variations of the respective light emitting elements and variations for example of constant current sources in the anode driver 11 can be corrected, and a light emission state in which intensity balance of EL elements which emit respective R, G, and B lights is also adjusted can be revived.

In this way, by constructing a display panel which realizes a full color display also in a way shown in FIG. 2, in a state in which the self-emitting module 1 is an individual body before the module 1 is connected with the main body substrate 6 side, intensity adjustment of the respective light emitting elements can be performed, that is, the respective current values supplied from the driver IC 5 can be set appropriately. Thus, the present structure can contribute to a reduction of the fabrication cost since the adjustment work for intensity prior to shipping of the product can be made easier.

What is claimed is:

1. A self light emitting type display device comprising:
a self-emitting module comprising a display panel on which a plurality of self-emitting elements are arranged, a circuit board whose one end portion is connected with the display panel to supply drive current to the respective self-emitting elements of the display panel, a memory which is loaded on the circuit board and in which data for adjusting light emission intensities of the respective light emitting elements is stored, and a drive unit which is loaded on the circuit board and which is equipped with a function of generating the drive current which is for adjusting the light emission intensities of the respective light emitting elements based on the data stored in the memory, and
a main body substrate which is connected with the other end of the circuit board in the self-emitting module and in which an operational power supply means supplying operational power source to the self-emitting module side via the circuit board is loaded.

2. The self light emitting type display device according to claim 1, wherein the circuit board in which the memory and the drive unit are loaded is constructed by an FPC (flexible printed circuit board).

3. The self light emitting type display device according to claim 1, which is constructed in such a way that a connector is connected with the other end of the circuit board and that the self-emitting module is detachably connected with the main body substrate via the connector.

4. The self light emitting type display device according to claim 2, which is constructed in such a way that a connector is connected with the other end of the circuit board and that the self-emitting module is detachably connected with the main body substrate via the connector.

5. The self light emitting type display device according to any one of claims 1 to 4, wherein the data stored in the memory is rewritable and that the memory has a non-volatile function.

6. The self light emitting type display device according to any one of claims 1 to 4, wherein self-emitting elements which emit respective R (red), G (green), and B (blue) color lights are arranged on the display panel and that data for adjusting intensities of respective colors is stored in the memory.

7. The self light emitting type display device according to claim 5, wherein self-emitting elements which emit respective R (red), G (green), and B (blue) color lights are arranged on the display panel and that data for adjusting intensities of respective colors is stored in the memory.

8. The self light emitting type display device according to claim 6, wherein the data which adjusts intensities of respective emitted color lights can be obtained by setting at predetermined values intensity and chromaticity of synthesized white light by the R, G, and B emitted from the self-emitting elements arranged on the display panel.

9. The self light emitting type display device according to claim 7, wherein the data which adjusts intensities of respective emitted color lights can be obtained by setting at predetermined values intensity and chromaticity of synthesized white light by the R, G, and B emitted from the self-emitting elements arranged on the display panel.

10. The self light emitting type display device according to any one of claims 1 to 4, wherein data related to fabrication history of the self-emitting module is stored in the memory other than the data for adjusting light emission intensities of the respective light emitting elements.

11. The self light emitting type display device according to claim 5, wherein data related to fabrication history of the self-emitting module is stored in the memory other than the data for adjusting light emission intensities of the respective light emitting elements.

12. The self light emitting type display device according to claim 6, wherein data related to fabrication history of the self-emitting module is stored in the memory other than the data for adjusting light emission intensities of the respective light emitting elements.

13. The self light emitting type display device according to claim 7, wherein data related to fabrication history of the self-emitting module is stored in the memory other than the data for adjusting light emission intensities of the respective light emitting elements.

14. The self light emitting type display device according to claim 8, wherein data related to fabrication history of the self-emitting module is stored in the memory other than the data for adjusting light emission intensities of the respective light emitting elements.

15. The self light emitting type display device according to claim 9, wherein data related to fabrication history of the self-emitting module is stored in the memory other than the data for adjusting light emission intensities of the respective light emitting elements.

16. The self light emitting type display device according to claim 6, which is constructed in such a way that the respective self-emitting elements are driven by constant current by the drive unit and that adjustment of intensities of the respective self-emitting elements which emit the respective R, G, and B color lights is executed by adjusting constant current values which are controlled by the drive unit.

17. The self light emitting type display device according to claim 7, which is constructed in such a way that the respective self-emitting elements are driven by constant current by the drive unit and that adjustment of intensities of the respective self-emitting elements which emit the respective R, G, and B color lights is executed by adjusting constant current values which are controlled by the drive unit.

18. The self light emitting type display device according to claim 8, which is constructed in such a way that the respective self-emitting elements are driven by constant current by the drive unit and that adjustment of intensities of the respective self-emitting elements which emit the respective R, G, and B color lights is executed by adjusting constant current values which are controlled by the drive unit.

19. The self light emitting type display device according to claim 9, which is constructed in such a way that the respective self-emitting elements are driven by constant current by the drive unit and that adjustment of intensities of the respective self-emitting elements which emit the respective R, G, and B color lights is executed by adjusting constant current values which are controlled by the drive unit.

20. The self light emitting type display device according to any one of claims 1 to 4, wherein the self-emitting elements are organic EL elements.

* * * * *